(12) United States Patent
Liu et al.

(10) Patent No.: US 9,087,865 B2
(45) Date of Patent: Jul. 21, 2015

(54) SUBSTRATE TRANSFERRING SYSTEM AND SUBSTRATE TRANSFERRING METHOD

(75) Inventors: Chun Liu, Guangdong (CN); Chang-Hung Pan, Guangdong (CN)

(73) Assignee: SHENZHEN CHINA STAR OPTOELECTRONICS TECHNOLOGY CO., LTD., Shenzhen, Guangdong Province (CN)

( * ) Notice: Subject to any disclaimer, the term of this patent is extended or adjusted under 35 U.S.C. 154(b) by 857 days.

(21) Appl. No.: 13/264,982

(22) PCT Filed: Jun. 17, 2011

(86) PCT No.: PCT/CN2011/075846
§ 371 (c)(1),
(2), (4) Date: Oct. 17, 2011

(87) PCT Pub. No.: WO2012/162914
PCT Pub. Date: Dec. 6, 2012

(65) Prior Publication Data
US 2012/0308342 A1 Dec. 6, 2012

(30) Foreign Application Priority Data
Jun. 3, 2011 (CN) .......................... 2011 1 0149785

(51) Int. Cl.
*H01L 21/677* (2006.01)
(52) U.S. Cl.
CPC ....... *H01L 21/67736* (2013.01); *Y10S 414/135* (2013.01); *Y10S 414/141* (2013.01)
(58) Field of Classification Search
CPC .............................................. H01L 21/67736
USPC .................... 414/217, 222.01, 806, 935, 941; 294/213
See application file for complete search history.

(56) References Cited

U.S. PATENT DOCUMENTS

| | | | | |
|---|---|---|---|---|
| 7,042,553 B2 * | 5/2006 | An et al. | .......................... | 355/72 |
| 7,278,817 B2 * | 10/2007 | Friedman et al. | ............. | 414/806 |
| 7,976,261 B2 * | 7/2011 | Snodgrass et al. | ........ | 414/222.01 |
| 8,033,288 B2 * | 10/2011 | Shiomi et al. | .................... | 134/66 |
| 8,157,496 B2 * | 4/2012 | Okuno et al. | ............ | 414/222.01 |

(Continued)

FOREIGN PATENT DOCUMENTS

| CN | 1900359 A | 1/2007 |
|---|---|---|
| CN | 1937201 A | 3/2007 |

(Continued)

*Primary Examiner* — Scott Lowe
(74) *Attorney, Agent, or Firm* — Cheng-Ju Chiang

(57) ABSTRACT

A substrate transferring system and a substrate transferring method are disclosed. The substrate transferring system comprises a substrate processing stage comprising a first substrate processing stage and a second substrate processing stage; a substrate outlet stage being adapted to output a substrate; a substrate transferring stage being disposed between the first substrate processing stage and the second substrate processing stage to receive the substrate from the substrate processing stage; a substrate supporting stage being disposed adjacent to the substrate transferring stage to receive the substrate from the substrate transferring stage; and a substrate conveying and transshipping stage being disposed in parallel with the substrate outlet stage to receive the substrate from the substrate supporting stage and to transfer the substrate to the substrate outlet stage. With this arrangement of the present disclosure, substrates can be transferred rapidly to shorten the substrate transferring period, thus improving the production efficiency.

11 Claims, 14 Drawing Sheets

(56) References Cited

U.S. PATENT DOCUMENTS

| | | | |
|---|---|---|---|
| 2004/0240972 A1* | 12/2004 | Mori et al. | 414/222.01 |
| 2005/0079041 A1* | 4/2005 | Campbell et al. | 414/626 |
| 2005/0135905 A1* | 6/2005 | Moriya et al. | 414/222.01 |
| 2006/0283688 A1* | 12/2006 | Blonigan et al. | 198/369.6 |
| 2007/0081881 A1* | 4/2007 | Okuno et al. | 414/217 |
| 2008/0199283 A1* | 8/2008 | Mitsuyoshi | 414/222.01 |
| 2008/0216880 A1* | 9/2008 | Shiomi et al. | 134/56 R |

FOREIGN PATENT DOCUMENTS

| | | |
|---|---|---|
| CN | 101144920 A | 3/2008 |
| WO | 99/18603 A1 | 4/1999 |
| WO | 2007/101228 A2 | 9/2007 |

* cited by examiner

SUBSTRATE TRANSFERRING SYSTEM AND SUBSTRATE TRANSFERRING METHOD

FIELD OF THE INVENTION

The present disclosure relates to a substrate transferring system and a substrate transferring method.

BACKGROUND OF THE INVENTION

Currently, manufacturing of a substrate must be completed through a number of processes which are carried out at different places. Accordingly, during the manufacturing process, a substrate transferring system must be used to transfer the substrate between different processes.

Referring to FIG. 1, there is shown a top view of a conventional substrate transferring system. The conventional substrate transferring system comprises a first substrate processing stage 40 and a second substrate processing stage 41, a substrate transferring stage 42, a substrate traversing stage 43, a substrate outlet stage 44 and a vacuum adsorption device 45. The substrate transferring stage 42 comprises a first roller-type transferring mechanism 421, the substrate traversing stage 43 comprises a second roller-type transferring mechanism 431 and a track 432, and the substrate outlet stage 44 comprises a third roller-type transferring mechanism 441.

Referring to FIG. 2 through FIG. 6, the conventional substrate transferring system operates as follow.

Firstly, as shown in FIG. 2, a first substrate 4001 and a second substrate 4002 are prepared by the first substrate processing stage 40 and the second substrate processing stage 41 respectively, and the first substrate 4001 is adsorbed by the vacuum adsorption device 45.

As shown in FIG. 3, the first substrate 4001 is transferred by the vacuum adsorption device 45 from the first substrate processing stage 40 to the substrate transferring stage 42.

As shown in FIG. 4, the substrate traversing stage 43 moves along the track 432 to a position aligned with the substrate transferring stage 42 to receive the first substrate 4001 transferred from the first roller-type transferring mechanism 421 of the substrate transferring stage 42; meanwhile, a third substrate 4003 is loaded onto the first substrate processing stage 40.

As shown in FIG. 5, after receiving the substrate 4001, the substrate traversing stage 43 moves towards the substrate outlet stage 44 along the track 432; meanwhile, the second substrate 4002 is adsorbed by the vacuum adsorption device 45 from the second substrate processing stage 41 onto the substrate transferring stage 42.

As shown in FIG. 6, the substrate traversing stage 43 moves to the substrate outlet stage 44 along the track 432, and transfers the first substrate 4001 to the substrate outlet stage 44 by means of the second roller-type transferring mechanism 431; meanwhile, a fourth substrate 4004 is loaded onto the second substrate processing stage 41.

However, the conventional substrate transferring system described above has the following drawbacks:

(1) the substrate traversing stage 43 is only able to receive one substrate at a time, and the substrate is transferred by a means of roller-type mechanism, so the transferring speed is relatively low and is only about 350 mm/s; and (2) the substrate traversing stage 43 is only able to transfer one substrate at a time. As shown in FIG. 6, when the first substrate 4001 is being transferred to the substrate outlet stage 44, the second substrate 4002 to be transferred next to the substrate traversing stage 43 is already waiting at the substrate transferring stage 42. However, the substrate traversing stage 43 will not return back until the substrate 4001 is transferred to the substrate outlet stage 44; moreover, only when the substrate traversing stage 43 returns back to the position aligned with the substrate transferring stage 42 as shown in FIG. 1, can the substrate transferring stage 42 transfer the next substrate 4002 to the substrate traversing stage 42 for transferring of the next substrate 4002.

Referring to FIG. 7, there is shown a schematic view of the tact time of the conventional substrate transferring system. Taking a 32-inch substrate as an example, the bottleneck of the conventional substrate transferring system exists in the substrate traversing stage 43: the tact time thereof is 17 seconds, which makes it impossible to transfer the substrate rapidly. Accordingly, the conventional substrate transferring system suffers from a low transferring speed, and this may lead to jamming of the substrates, decrease in throughput of the whole production line and degradation in the production efficiency.

In view of this, an urgent need exists in the art to provide a substrate transferring system and a substrate transferring method that can increase the substrate transferring speed and shorten the substrate transferring period.

SUMMARY OF THE INVENTION

A primary objective of the present disclosure is to provide a substrate transferring system and a substrate transferring method capable of transferring substrates rapidly to shorten the substrate production period and to improve the production efficiency.

To achieve this objective, the present disclosure provides a substrate transferring system, which comprises a substrate processing stage, a substrate transferring stage, a substrate supporting stage, a substrate conveying and transshipping stage and a substrate outlet stage. The substrate processing stage comprises a first substrate processing stage and a second substrate processing stage. The substrate outlet stage is adapted to output a substrate. The substrate transferring stage is disposed between the first substrate processing stage and the second substrate processing stage to receive the substrate from the substrate processing stage. The substrate supporting stage is disposed adjacent to the substrate transferring stage to receive the substrate from the substrate transferring stage. The substrate conveying and transshipping stage is disposed in parallel with the substrate outlet stage to receive the substrate from the substrate supporting stage and to transfer the substrate to the substrate outlet stage. The substrate transferring stage comprises a first supporting stage, a first transferring mechanism and a second transferring mechanism, and the substrate supporting stage further comprises a second supporting stage. The first transferring mechanism is adapted to transfer the first supporting stage to above the second supporting stage, and the second transferring mechanism is adapted to transfer the first supporting stage from above the second supporting stage to below the second supporting stage so as to deposit the substrate originally supported on the first supporting stage onto the second supporting stage.

Preferably, the first supporting stage comprises first supporting bars spaced apart from each other, the second supporting stage comprises second supporting bars spaced apart from each other, in the process of transferring the first supporting stage from above the second supporting stage to below the second supporting stage, the first supporting bars and the second supporting bars are interlaced with each other; and a spacing between every two adjacent first supporting bars is larger than a width of each of the second supporting bars and a spacing between every two adjacent second supporting bars is larger than a width of each of the first supporting bars.

Preferably, cushions are attached on the first supporting bars and the second supporting bars respectively.

Preferably, the cushions are sponges or air bladders.

Preferably, the first transferring mechanism is a horizontal movement mechanism; and the horizontal movement mechanism comprises a guide rail, a moving stage and a motor, and the motor drives the moving stage to move horizontally and linearly along the guide rail so as to drive the first supporting stage to above the second supporting stage.

Preferably, the first transferring mechanism is a horizontal rotation mechanism; and the horizontal rotation mechanism comprises a rotary shaft and a motor, and the motor drives the rotary shaft to rotate so as to rotate the first supporting stage to above the second supporting stage.

Preferably, the second transferring mechanism is a vertical movement mechanism; and the vertical movement mechanism comprises a lift and a motor, and the motor drives the lift to move vertically so as to drive the first supporting stage to below the second supporting stage.

To achieve the aforesaid objective, the present disclosure further provides a substrate transferring system, which comprises: a substrate processing stage, comprising a first substrate processing stage and a second substrate processing stage; a substrate outlet stage, being adapted to output a substrate. The substrate transferring system further comprises: a substrate transferring stage, being disposed between the first substrate processing stage and the second substrate processing stage to receive the substrate from the substrate processing stage; a substrate supporting stage, being disposed adjacent to the substrate transferring stage to receive the substrate from the substrate transferring stage; and a substrate conveying and transshipping stage, being disposed in parallel with the substrate outlet stage to receive the substrate from the substrate supporting stage and to transfer the substrate to the substrate outlet stage.

Preferably, the substrate transferring stage comprises a first supporting stage, a first transferring mechanism and a second transferring mechanism, and the substrate supporting stage comprises a second supporting stage; wherein the first transferring mechanism transfers the first supporting stage to above the second supporting stage, and the second transferring mechanism transfers the first supporting stage from above the second supporting stage to below the second supporting stage so as to deposit the substrate originally supported on the first supporting stage onto the second supporting stage.

Preferably, the first transferring mechanism is a horizontal movement mechanism or a horizontal rotation mechanism, and the second transferring mechanism is a vertical movement mechanism.

Preferably, the first supporting stage comprises first supporting bars spaced apart from each other, the second supporting stage comprises second supporting bars spaced apart from each other, and in the process of transferring the first supporting stage from above the second supporting stage to below the second supporting stage, the first supporting bars and the second supporting bars are interlaced with each other.

Preferably, the number of the first supporting bars is three, and the number of the second supporting bars is two.

Preferably, the substrate transferring system further comprises: a first vacuum adsorption transferring device, being adapted to adsorb the substrate from the substrate processing stage onto the substrate transferring stage; and a second vacuum adsorption transferring device, being adapted to adsorb the substrate from the substrate supporting stage onto the substrate conveying and transshipping stage.

Preferably, the substrate conveying and transshipping stage and the substrate outlet stage are each provided with a roller-type transferring mechanism respectively for transferring the substrate from the substrate conveying and transshipping stage to the substrate outlet stage.

To achieve the aforesaid objective, the present disclosure further provides a substrate transferring method, which comprises the following steps of: moving a substrate from a substrate processing stage to a substrate transferring stage; transferring the substrate from the substrate transferring stage to a substrate supporting stage; moving the substrate from the substrate supporting stage to a substrate conveying and transshipping stage; transferring the substrate from the substrate conveying and transshipping stage to a substrate outlet stage; and outputting the substrate from the substrate outlet stage.

Preferably, the step of moving a substrate from a substrate processing stage to a substrate transferring stage comprises: moving the substrate from the substrate processing stage to the substrate transferring stage by means of the first vacuum adsorption transferring device; and the step of moving the substrate from the substrate supporting stage to a substrate conveying and transshipping stage comprises: moving the substrate from the substrate supporting stage to the substrate conveying and transshipping stage by means of the second vacuum adsorption transferring device.

Preferably, when the second vacuum adsorption transferring device is moving the substrate from the substrate supporting stage to the substrate conveying and transshipping stage, the substrate supporting stage begins to receive a next substrate; and when the substrate conveying and transshipping stage is transferring the substrate to the substrate outlet stage, the second vacuum adsorption transferring device returns back to pick up the next substrate.

The present disclosure has the following benefits: by disposing a substrate conveying and transshipping stage as a transition stage, the substrate is firstly transferred by the substrate transferring stage to the substrate supporting stage, then transferred from the substrate supporting stage to the substrate conveying and transshipping stage, and finally transferred from the substrate conveying and transshipping stage directly to the substrate outlet stage for output. In this way, substrates can be transferred rapidly to shorten the production period of the substrate and to improve the production efficiency, thus overcoming the drawback of the conventional substrate transferring system that the traversing stage has to move back and forth more than once in order to transfer one substrate.

BRIEF DESCRIPTION OF THE DRAWINGS

The components in the drawings are not necessarily drawn to scale, the emphasis instead being placed upon clearly illustrating the principles of at least one embodiment of the present disclosure. In the drawings, like reference numerals designate corresponding parts throughout various views, and all the views are schematic.

DETAILED DESCRIPTION OF THE INVENTION

Figure 1:
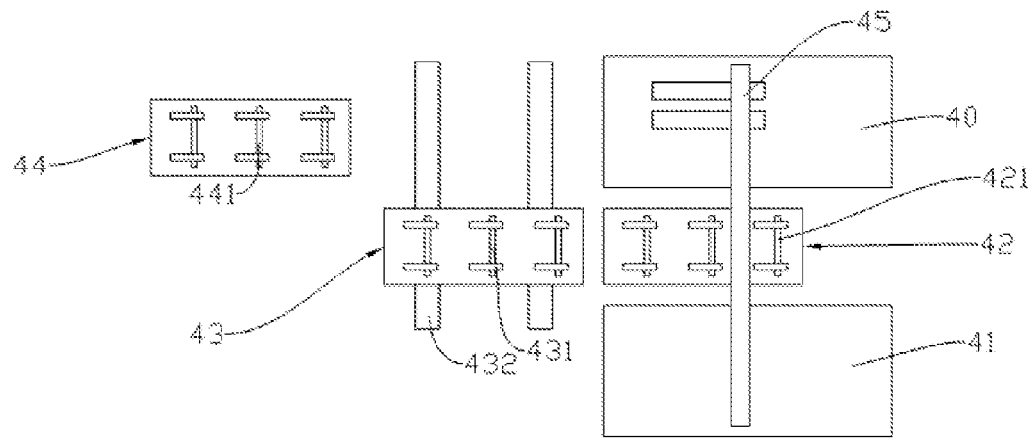
FIG. 1 is a top view of a conventional substrate transferring system.
Figure 2:
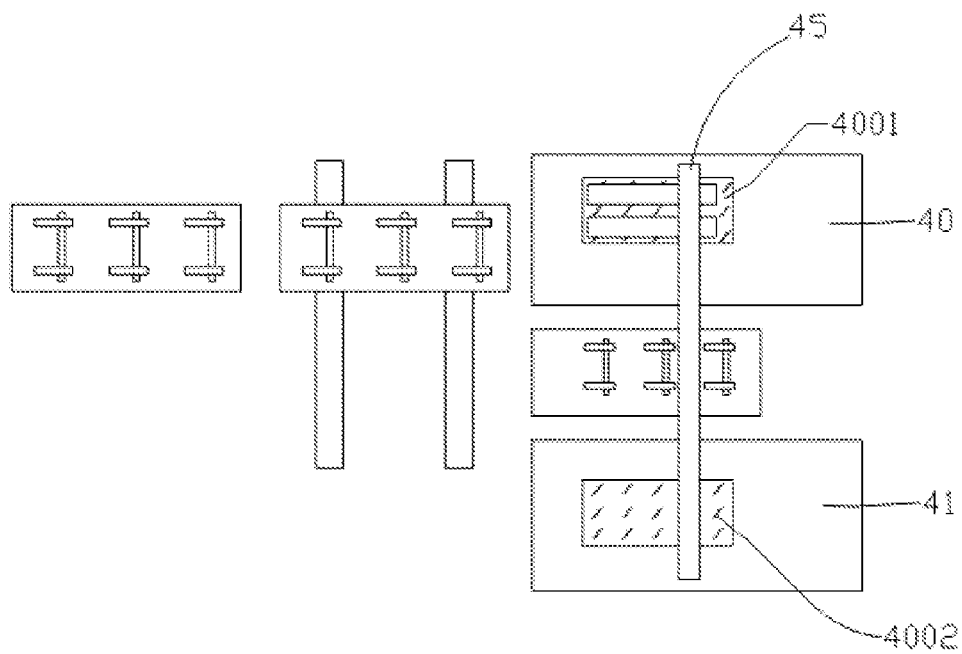
FIGS. 2 to 6 are schematic views illustrating operating states of the conventional substrate transferring system.
Figure 3:
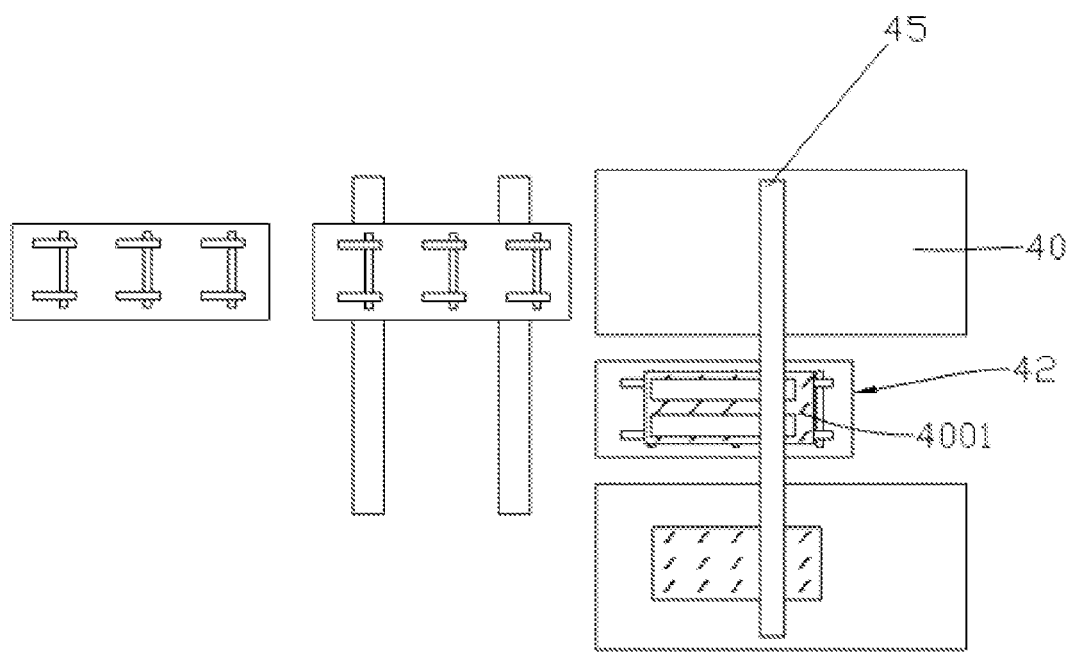
Figure 4:
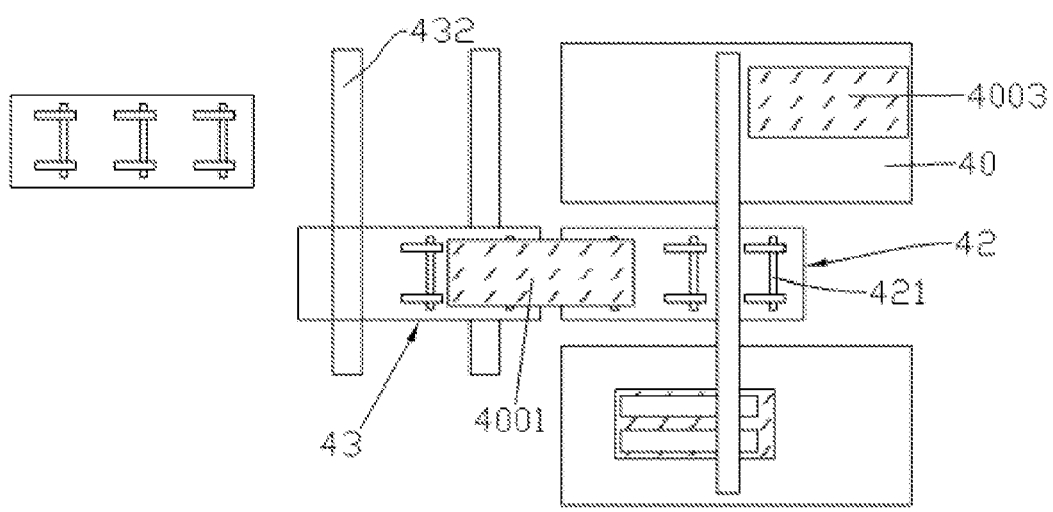
Figure 5:
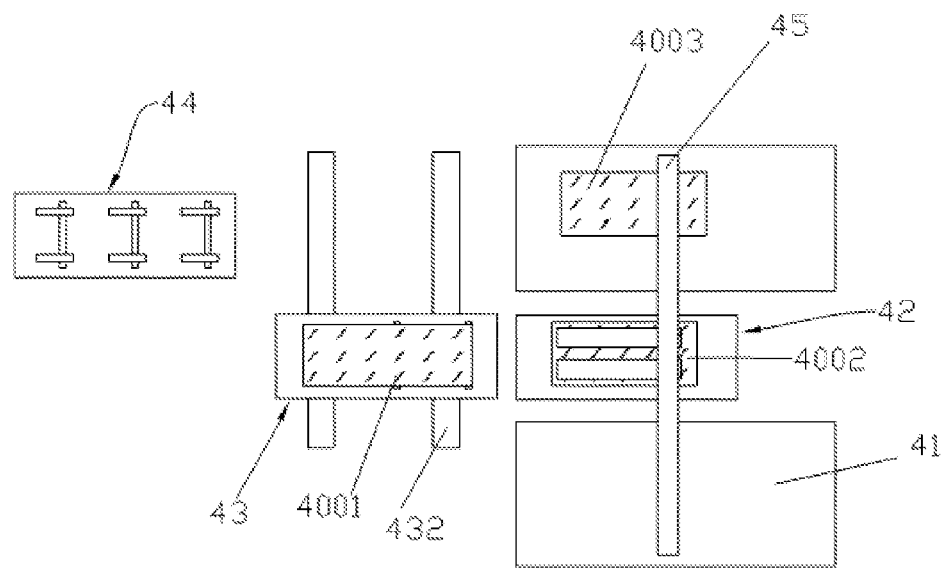
Figure 6:
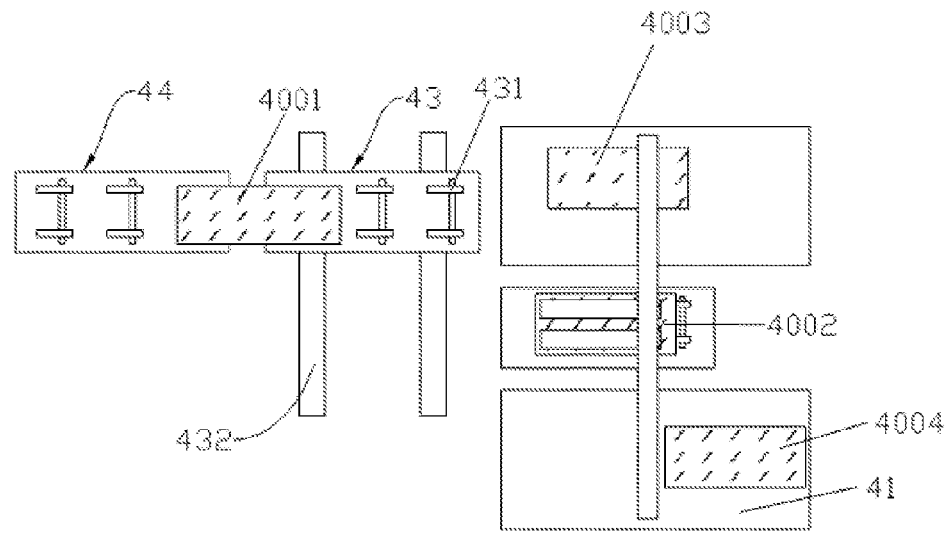
Figure 7:
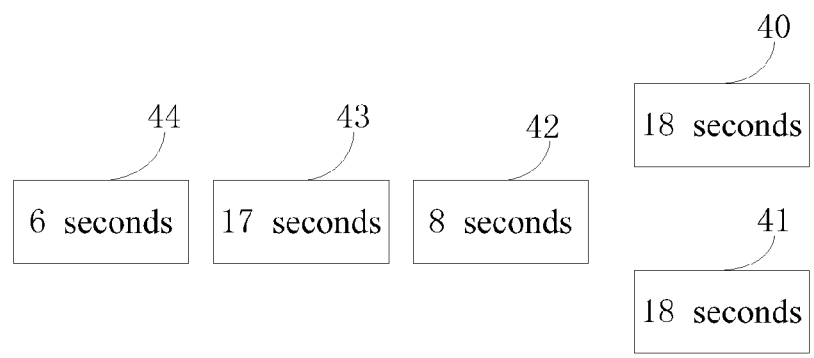
FIG. 7 is a schematic view illustrating the tact time of the conventional substrate transferring system.

The present disclosure is more particularly described in the following examples that are intended as illustrative only since numerous modifications and variations therein will be apparent to those skilled in the art. Various embodiments of the disclosure are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

Figure 8:
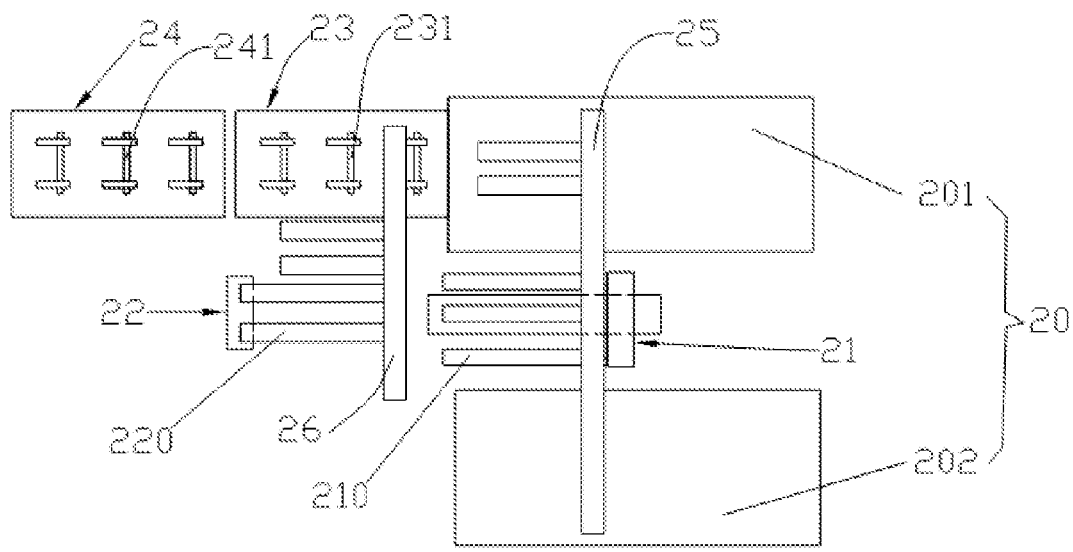
FIG. 8 is a top view of a preferred embodiment of a substrate transferring system according to the present disclosure.

Referring to FIG. 8, FIG. 8 is a top view of a preferred embodiment of a substrate transferring system according to the present disclosure. The substrate transferring system of the present disclosure comprises a substrate processing stage 20, a substrate transferring stage 21, a substrate supporting stage 22, a substrate conveying and transshipping stage 23, a substrate outlet stage 24, a first vacuum adsorption device 25 and a second vacuum adsorption device 26.

The substrate processing stage 20 is adapted to process (e.g., to perform wiring, line cutting, coating of an alignment film, or the like processing) a surface of a substrate, and comprises a first substrate processing stage 201 and a second substrate processing stage 202. In this embodiment, the substrate processing stage 20 is used to cut away unnecessary lines on the substrate surface.

The substrate transferring stage 21 is disposed between the first substrate processing stage 201 and the second substrate processing stage 202 to receive the substrate from the substrate processing stage 20 (i.e., from the first substrate processing stage 201 or the second substrate processing stage 202).

The substrate supporting stage 22 is disposed adjacent to the substrate transferring stage 21 to receive the substrate from the substrate transferring stage 21.

The substrate conveying and transshipping stage 23 is disposed in parallel with the substrate outlet stage 24 to receive the substrate from the substrate supporting stage 22 and to transfer the substrate to the substrate outlet stage 24.

The substrate outlet stage 24 is adapted to output the substrate.

The first vacuum adsorption device 25 is disposed above the first substrate processing stage 201, the second substrate processing stage 202 and the substrate transferring stage 21 to adsorb a substrate from the first substrate processing stage 201 or the second substrate processing stage 202 to the substrate transferring stage 21.

The second vacuum adsorption device 26 is disposed above the substrate conveying and transshipping stage 23 and the substrate supporting stage 22 to transfer the substrate from the substrate supporting stage 22 to the substrate conveying and transshipping stage 23.

The substrate conveying and transshipping stage 23 is provided with a first roller-type transferring mechanism 231 and the substrate outlet stage 24 is provided with a second roller-type transferring mechanism 241 to transfer the substrate from the substrate conveying and transshipping stage 23 to the substrate outlet stage 24.

Figure 9:
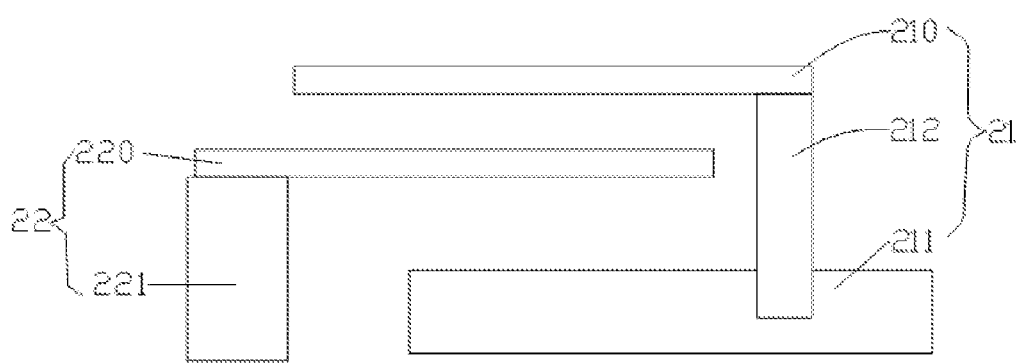
FIG. 9 is a side view of a substrate transferring stage and a substrate supporting stage of the substrate transferring system according to the present disclosure.

Referring to FIG. 9, there is shown a side view of the substrate transferring stage 21 and the substrate supporting stage 22.

In this embodiment of the present disclosure, the substrate transferring stage 21 comprises a first supporting stage 210, a first transferring mechanism 211 and a second transferring mechanism 212. The substrate supporting stage 22 comprises a second supporting stage 220 and a supporting mechanism 221 for supporting the second supporting stage 220.

The first transferring mechanism 211 is adapted to transfer the first supporting stage 210 to above the second supporting stage 220, and the second transferring mechanism 212 is adapted to transfer the first supporting stage 210 from above the second supporting stage 220 to below the second supporting stage 220 so that the substrate originally supported on the first supporting stage 210 can be deposited on the second supporting stage 220.

Figure 10:
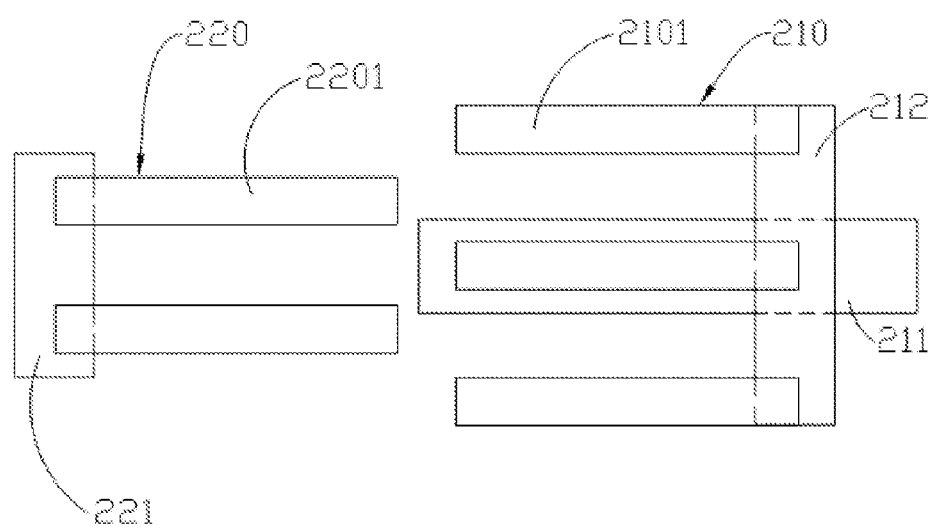
FIG. 10 is an enlarged top view of the substrate transferring stage and the substrate supporting stage of the substrate transferring system according to the present disclosure.

Referring to FIG. 10, there is shown an enlarged top view of the substrate transferring stage 21 and the substrate supporting stage 22.

In this embodiment of the present disclosure, the first supporting stage 210 comprises first supporting bars 2101 parallel to and space apart from each other, and the second supporting stage 220 comprises second supporting bars 2201 parallel to and spaced apart from each other. During the process of transferring the first supporting stage 210 from above the second supporting stage 220 to below the second supporting stage 220, the first supporting bars 2101 and the second supporting bars 2201 are interlaced with each other. In order to ensure that the first supporting bars 2101 and the second supporting bars 2201 are interlaced with each other and that the substrate originally supported on the first supporting stage 210 can be deposited onto the second supporting stage 220, a spacing between every two adjacent first supporting bars 2101 is larger than a width of each of the second supporting bars 2201 and a spacing between every two adjacent supporting bars 2201 is larger than a width of each of the first supporting bars 2101.

Preferably, the number of the first supporting bars 2101 is three, and the number of the second supporting bars 2201 is two. It shall be appreciated that, the present disclosure is not merely limited thereto, and the number of the first supporting bars 2101 and that of the second supporting bars 2201 may be optionally adjusted.

In this embodiment of the present disclosure, cushions such as sponges or air bladders may be attached on the first supporting bars 2101 of the first supporting stage 210 and the second supporting bars of the second supporting stage 220 to protect the substrate from being scratched or broken during the transferring process.

Figure 11:
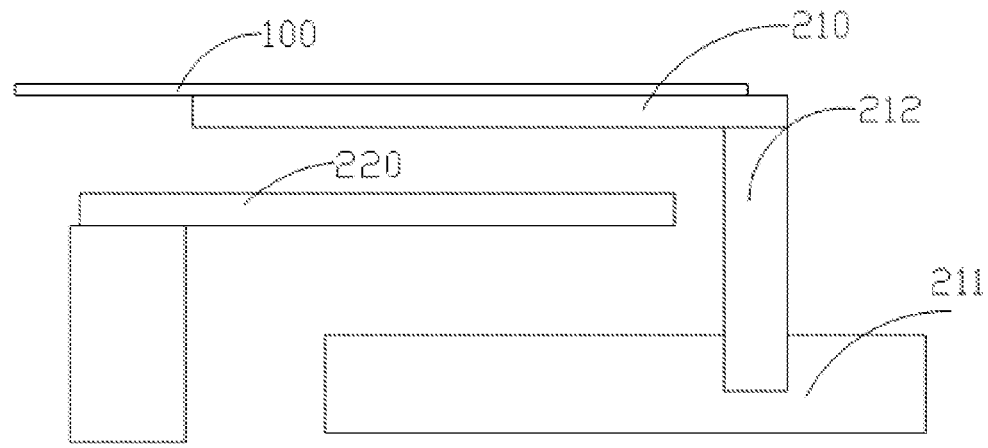
FIG. 11 is a schematic view illustrating a first operating state of the substrate transferring stage and the substrate supporting stage of the substrate transferring system according to the present disclosure.
Figure 12:
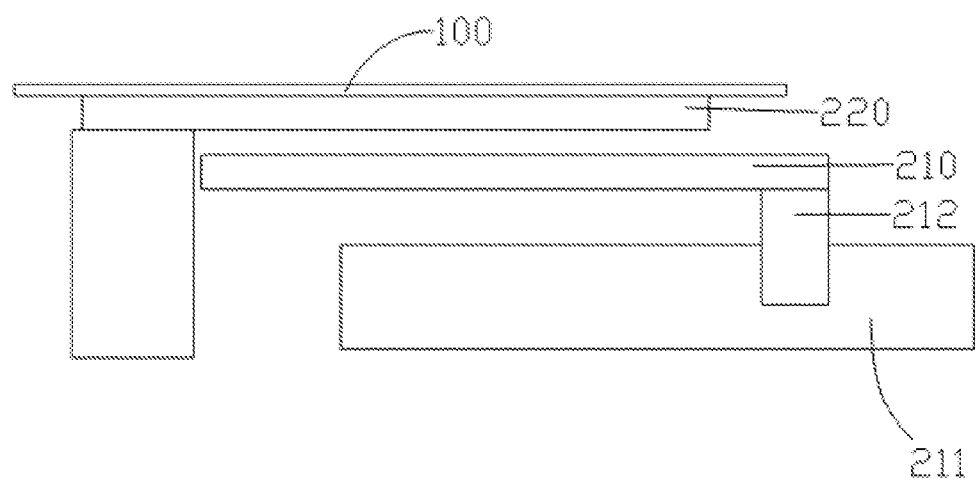
FIG. 12 is a schematic view illustrating a second operating state of the substrate transferring stage and the substrate supporting stage of the substrate transferring system according to the present disclosure.

Referring to FIG. 11 and FIG. 12, FIG. 11 illustrates an operating state when the first supporting stage 210 is located above the second supporting stage 220, and FIG. 12 illustrates an operating state when the first supporting state 210 is located below the second supporting stage 220.

Here, the first transferring mechanism 211 is a horizontal movement mechanism or a horizontal rotation mechanism.

Preferably, in case of being a horizontal movement mechanism, the first transferring mechanism 211 may comprise, for example, a guide rail (not shown), a moving stage (not shown) and a motor (not shown). The guide rail may be an air-suspension guide rail, and the moving stage is driven by the motor to move in horizontally and linearly along the guide rail so that the first supporting stage 210 driven by the horizontal movement mechanism finally reaches the above of the second supporting stage 220. Here, the horizontal linear movement refers to horizontal linear reciprocating movement.

In case of being a horizontal rotation mechanism, the first transferring mechanism 211 may comprise, for example, a rotary shaft (not shown) and a motor (not shown). The motor drives the rotary shaft to rotate so that the first supporting stage 210 is finally rotated to above the second supporting stage 220. Of course, the first supporting stage 210 shall be sufficiently long in this case; that is, when the first supporting stage 210 and the second supporting stage 220 are in the same direction, the first supporting stage 210 shall have a length at least larger than a spacing between the substrate transferring stage 21 and the substrate supporting stage 22.

The second transferring mechanism 212 is a vertical movement mechanism comprising a lift (not shown) and a motor (not shown). The lift is driven by the motor to move vertically so that the first supporting stage 210 driven by the second transferring mechanism 212 is finally transferred to below the second supporting stage 220. Thus, the substrate originally supported on the first supporting stage 210 can be deposited on the second supporting stage 220. Of course, the vertical movement described herein refers to reciprocating movement in a vertical direction.

In this embodiment of the present disclosure, by use of the first supporting bars 2101 and the second supporting bars 2201 interlaced with each other, the substrate 100 originally supported on the first supporting stage 210 can be deposited on the second supporting stage 220. Here, the substrate 100 may be a liquid crystal display (LCD) substrate, a plasma display substrate, a glass substrate or any other substrate of a sheet form.

Referring to FIGS. 13 through 18, there are shown schematic views illustrating operating states of the substrate transferring system according to the present disclosure.

Figure 13:
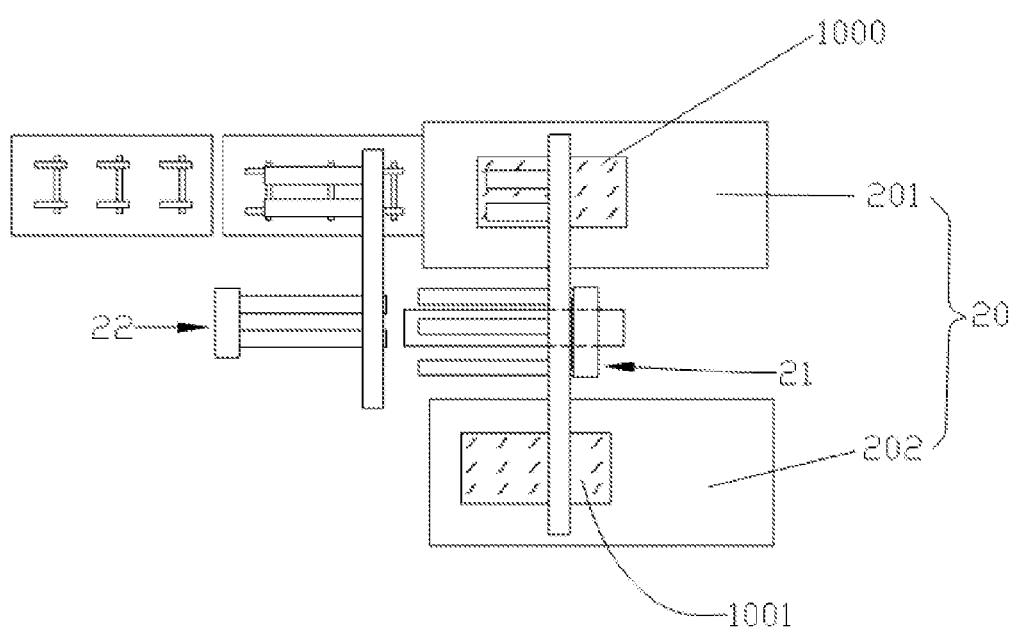
FIGS. 13 to 18 are schematic views illustrating operating states of the substrate transferring system according to the present disclosure.

As shown in FIG. 13, both the substrate transferring stage 21 and the substrate supporting stage 22 are in a standby state, and a first substrate 1000 and a second substrate 1001 are provided by the first substrate processing stage 201 and the second substrate processing stage 202 located at two sides of the substrate transferring stage 21 respectively.

Figure 14:
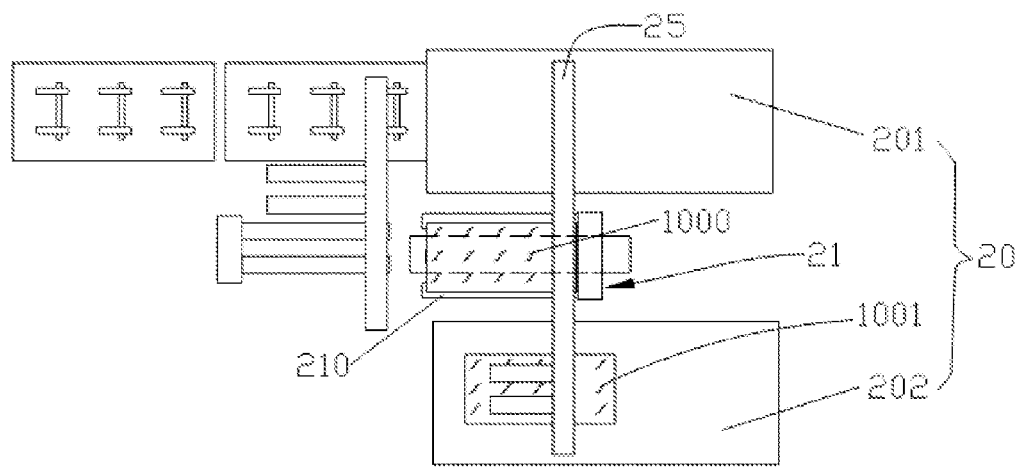

As shown in FIG. 14, the substrate 1000 is moved from the substrate processing stage 201 to the substrate transferring stage 21. Specifically, the first substrate 1000 is adsorbed by the first vacuum adsorption transferring device 25 from the first substrate processing stage 201 and is transferred to the first supporting stage 210 of the substrate transferring stage 21. After transferring the first substrate 1000 to the first supporting stage 210, the first vacuum adsorption transferring device 25 moves to the second substrate processing stage 202 to prepare for adsorbing the second substrate 1001.

Figure 15:
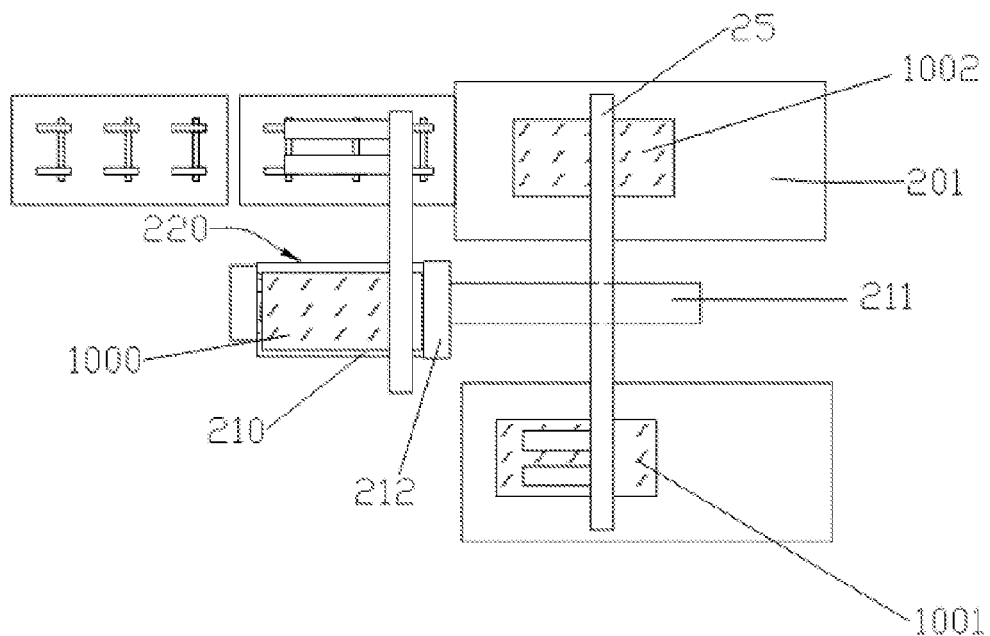

Referring to FIG. 15, the substrate 1000 is transferred from the substrate transferring stage 21 to the substrate supporting stage 22. Specifically, referring also to FIG. 11 and FIG. 12, the first supporting stage 210 is transferred by the first transferring mechanism 211 to above the second supporting stage 220, and is then transferred by the second transferring mechanism 212 from above the second supporting stage 220 to below the second supporting stage 220. Finally, the first substrate 1000 originally supported on the first supporting stage 210 is deposited on the second supporting stage 220 by means of the first supporting bars 2101 of the first supporting stage 210 and the second supporting bars 2201 of the second supporting stage 220. Additionally, the first vacuum adsorption transferring device 25 adsorbs the second substrate 1001, and meanwhile, the first substrate processing stage 201 proceeds to load a third substrate 1002.

Figure 16:
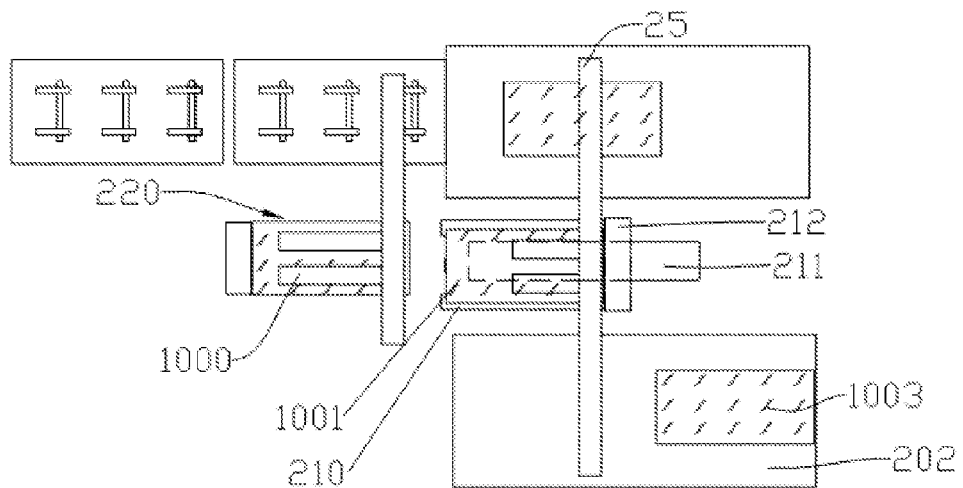

As shown in FIG. 16, after the first substrate 1000 is deposited on the second supporting stage 220, the second vacuum adsorption transferring device 26 moves to above the second supporting stage 220 to adsorb the first substrate 1000. Meanwhile, the first supporting stage 210 is transferred by the first transferring mechanism 211 from below the second supporting stage 220 back to a position corresponding to the standby state; and then by means of the second transferring mechanism 212, the first supporting stage 210 returns to a height where it regains the standby state and further receives the second substrate 1001 transferred by the first vacuum adsorption transferring device 25. Additionally, the second substrate processing stage 202 proceeds to load a fourth substrate 1003.

Figure 17:
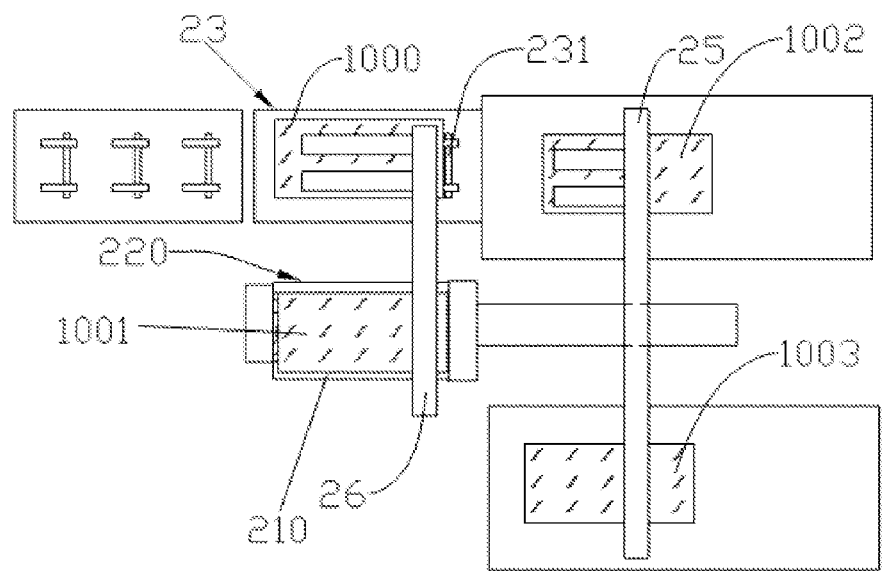

As shown in FIG. 17, the first substrate 1000 is transferred by the second vacuum adsorption transferring device 26 to the first roller-type transferring mechanism 231 of the substrate conveying and transshipping stage 23; meanwhile, the second supporting stage 220 receives the second substrate 1001. Additionally, the first vacuum adsorption transferring device 25 returns back to the first substrate processing stage 201 to adsorb the third substrate 1002.

Figure 18:
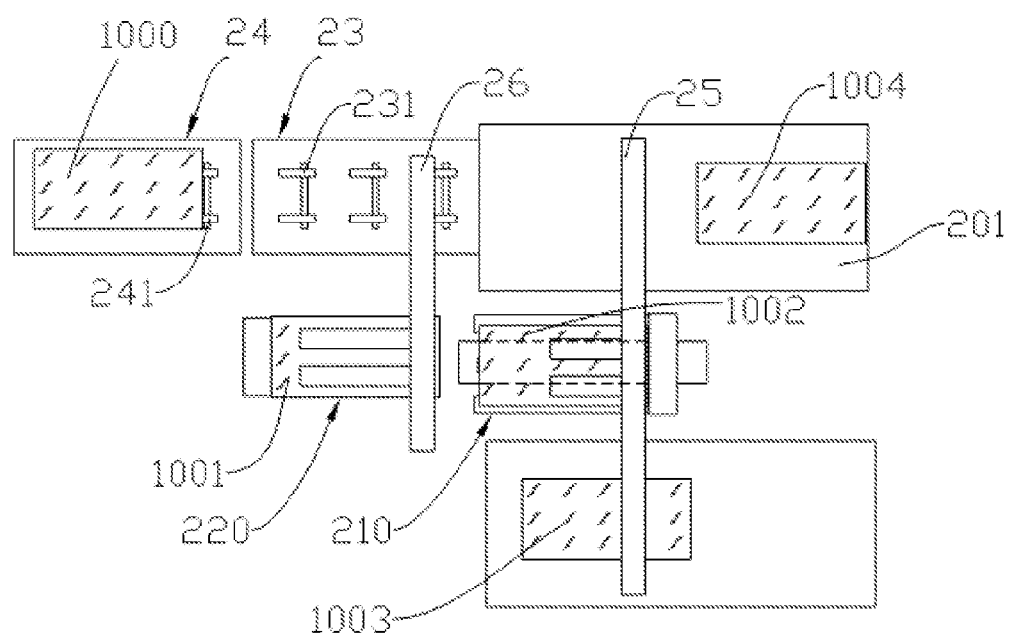

As shown in FIG. 18, the first substrate 1000 is transferred by the first roller-type transferring mechanism 231 from the substrate conveying and transshipping stage 23 via the second roller-type transferring mechanism 241 to the substrate outlet stage 24; meanwhile, the second vacuum adsorption transferring device 26 returns back to above the second supporting stage 220 to adsorb the second substrate 1001, and the first supporting stage 210 receives the third substrate 1002 from the first vacuum adsorption transferring device 25. Additionally, the first substrate processing stage 201 proceeds to load a fifth substrate 1004. Subsequently, the second substrate 1001 is transferred by the second vacuum adsorption transferring device 26 to the substrate conveying and transshipping stage 23; and likewise, the second substrate 1001 will also be transferred by the substrate conveying and transshipping stage 23 to the substrate outlet stage 24 for output. In this way, the process of transferring a substrate is repeated cyclically.

Figure 19:
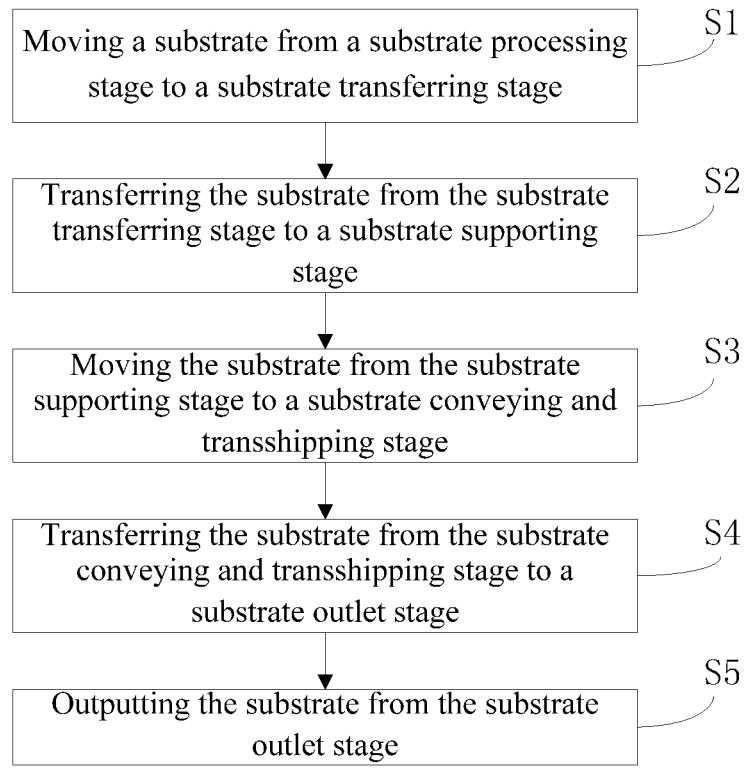
FIG. 19 is a flowchart of a preferred embodiment of a substrate transferring method according to the present disclosure.

Referring next to FIG. 19, there is shown a flowchart of a preferred embodiment of a substrate transferring method according to the present disclosure. The substrate transferring method according to the present disclosure comprises the following steps:

step S1: moving a substrate from a substrate processing stage to a substrate transferring stage;

step S2: transferring the substrate from the substrate transferring stage to a substrate supporting stage;

step S3: moving the substrate from the substrate supporting stage to a substrate conveying and transshipping stage;

step S4: transferring the substrate from the substrate conveying and transshipping stage to a substrate outlet stage; and step S5: outputting the substrate from the substrate outlet stage.

In the step S1, unnecessary lines on a surface of the substrate are cut away firstly on the substrate processing stage, and then the substrate is moved by the first vacuum adsorption transferring device from the substrate processing stage to the substrate transferring stage.

Figure 20:
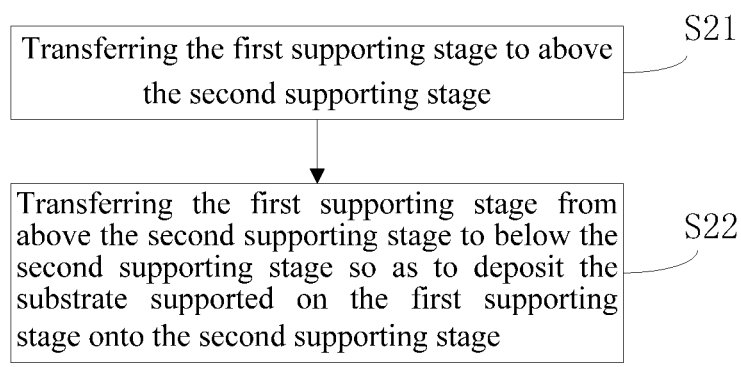
FIG. 20 is a sub-flowchart of a preferred embodiment of the substrate transferring method according to the present disclosure.

In this embodiment of the present disclosure, the substrate transferring stage comprises a first supporting stage and the substrate supporting stage comprises a second supporting stage. Accordingly, the step S2 further comprises the following sub-steps as shown in FIG. 20.

Step S21: transferring the first supporting stage with the substrate supported thereon to above the second supporting stage.

For example, the first supporting stage may be transferred by the first transferring mechanism (e.g., a horizontal movement mechanism or a horizontal rotation mechanism) to above the second supporting stage.

Step S22: transferring the first supporting stage from above the second supporting stage to below the second supporting stage so as to deposit the substrate originally supported on the first supporting stage onto the second supporting stage.

For example, the first supporting stage may be transferred by the second transferring mechanism (e.g., a vertical movement mechanism) from above the second supporting stage to below the second supporting stage so as to deposit the substrate originally supported on the first supporting stage onto the second supporting stage for transferring purpose.

In the step S3, the substrate is moved by the second vacuum adsorption transferring device from the substrate supporting stage to the substrate conveying and transshipping stage. Furthermore, when the substrate is being moved by the second vacuum adsorption transferring device from the substrate supporting stage to the substrate conveying and transshipping stage, the substrate supporting stage begins to receive a next substrate.

In the step S4, when the substrate conveying and transshipping stage is transferring the substrate to the substrate outlet stage, the second vacuum adsorption transferring device returns back to the substrate supporting stage to pick up the next substrate. The next substrate is then moved by the second vacuum adsorption transferring device to the substrate conveying and transshipping stage and is further transferred from the substrate conveying and transshipping stage to the substrate outlet stage for output. This process is repeated cyclically for transferring of the substrates.

Figure 21:
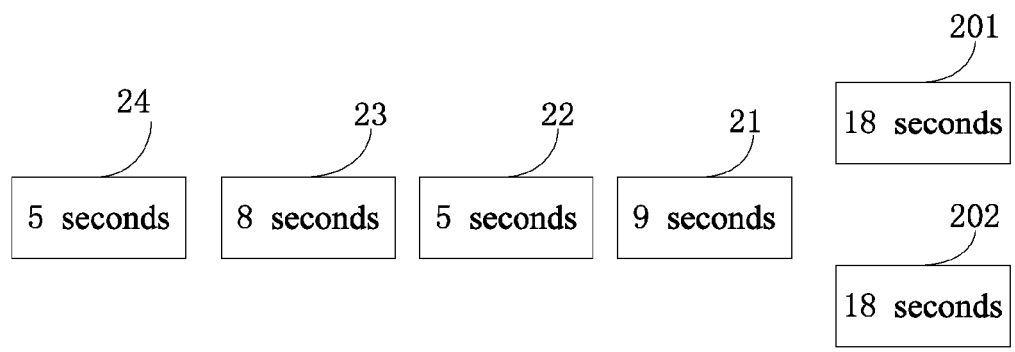
FIG. 21 is a schematic view illustrating the tact time of the substrate transferring system and the substrate transferring method according to the present disclosure.

Referring to FIG. 21, there is shown a schematic view illustrating the tact time of the substrate transferring system and the substrate transferring method according to the present disclosure. Taking a 32-inch substrate as an example, the tact time of transferring the substrate from the substrate transferring stage 21 to the substrate outlet stage 24 is reduced significantly as compared to that of the conventional substrate transferring system. Although the bottleneck in terms of the tact time now exists in the substrate transferring stage 21, the tact time thereof has been reduced to nine seconds, which represents a significant improvement on the conventional substrate transferring stage.

In summary, according to the substrate transferring system and the substrate transferring method of the present disclosure, supporting bars of the substrate transferring stage 21 and the substrate supporting stage 22 are disposed to be interlaced with each other to transfer the substrate therebetween, and a fixed substrate conveying and transshipping stage 23 is disposed between the substrate supporting stage 22 and the substrate outlet stage 24 as a transition area. This, in combination with transferring actions of the first vacuum adsorption transferring device 25 and the second vacuum adsorption transferring device 26, can reduce the waiting time during the substrate transferring process and increase the transferring speed of substrates. Thereby, the drawback of the conventional substrate transferring system that the throughput of the whole production line is low due to jamming of substrates caused by a low transferring speed can be overcome.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A substrate transferring system, comprising:
a substrate processing stage, comprising a first substrate processing stage and a second substrate processing stage;
a substrate outlet stage comprising a first base and a first roller-type transferring means mounted on the first base, and being adapted to output a substrate;
a substrate transferring stage, being disposed between the first substrate processing stage and the second substrate processing stage to receive the substrate from the substrate processing stage;
a substrate supporting stage, being disposed adjacent to the substrate transferring stage to receive the substrate from the substrate transferring stage; and
a substrate conveying and transshipping stage comprising a second base and a second roller-type transferring means mounted on the second base, and being disposed in parallel with the substrate outlet stage to receive the substrate from the substrate supporting stage by the second roller-type transferring means and to transfer the substrate to the substrate outlet stage via the first roller-type transferring means;
wherein the substrate transferring stage comprises a first supporting stage, a first transferring mechanism and a second transferring mechanism, and the substrate supporting stage further comprises a second supporting stage and a supporting mechanism to support the second supporting stage, the second supporting stage perpendicularly extend from a top of the supporting mechanism, and wherein the first transferring mechanism transfers the first supporting stage to above the second supporting stage, and the second transferring mechanism transfers the first supporting stage from above the second supporting stage to below the second supporting stage so as to deposit the substrate originally supported on the first supporting stage onto the second supporting stage;
wherein the second supporting stage and the supporting mechanism of the substrate supporting stage are neither removable nor rotatable, and locations of the second supporting stage and the supporting mechanism of the substrate supporting stage, the second base of the substrate conveying and transshipping stage, and the first base of the substrate outlet stage are always kept fixed during all the time of that the substrate is transferred from the first substrate processing stage or the second substrate processing stage to the substrate outlet stage, and the substrate outlet stage has a same axis as the substrate conveying and transshipping stage along a substrate transferring direction from the substrate conveying and transshipping stage to the substrate outlet stage.

2. The substrate transferring system of claim 1, wherein the first supporting stage comprises first supporting bars spaced apart from each other, the second supporting stage comprises second supporting bars spaced apart from each other, and in the process of transferring the first supporting stage from above the second supporting stage to below the second supporting stage, the first supporting bars and the second supporting bars are interlaced with each other, and wherein a spacing between every two adjacent first supporting bars is larger than a width of each of the second supporting bars and a spacing between every two adjacent second supporting bars is larger than a width of each of the first supporting bars.

3. The substrate transferring system of claim 1, wherein:
the first transferring mechanism is configured to drive the first supporting stage to above the second supporting stage by making the first supporting stage move horizontally.

4. The substrate transferring system of claim 1, wherein:
the first transferring mechanism is configured to rotate the first supporting stage to above the second supporting stage.

5. The substrate transferring system of claim 1, wherein:
the second transferring mechanism is configured to move vertically so as to drive the first supporting stage to below the second supporting stage.

6. A substrate transferring method, comprising the following steps of:
providing the substrate transferring system of claim 1;
moving the substrate from the substrate processing stage to the substrate transferring stage;
transferring the substrate from the substrate transferring stage to the substrate supporting stage;
moving the substrate from the substrate supporting stage to the substrate conveying and transshipping stage;
transferring the substrate from the substrate conveying and transshipping stage to the substrate outlet stage; and
outputting the substrate from the substrate outlet stage.

7. The substrate transferring method of claim 6, wherein:
the step of moving the substrate from the substrate processing stage to the substrate transferring stage comprises:
moving the substrate from the substrate processing stage to the substrate transferring stage by means of the first vacuum adsorption transferring device; and
the step of moving the substrate from the substrate supporting stage to the substrate conveying and transshipping stage comprises: moving the substrate from the substrate supporting stage to the substrate conveying and transshipping stage by means of the second vacuum adsorption transferring device.

8. The substrate transferring method of claim 7, wherein:
when the second vacuum adsorption transferring device is moving the substrate from the substrate supporting stage to the substrate conveying and transshipping stage, the substrate supporting stage begins to receive a next substrate; and
when the substrate conveying and transshipping stage is transferring the substrate to the substrate outlet stage, the second vacuum adsorption transferring device returns back to pick up the next substrate.

9. A substrate transferring system, comprising:
a substrate processing stage, comprising a first substrate processing stage and a second substrate processing stage;
a substrate outlet stage comprising a first base and a first roller-type transferring means mounted on the first base, and being adapted to output a substrate;
a substrate transferring stage comprising a first supporting stage, a first transferring mechanism and a second transferring mechanism connecting the first supporting stage and the first transferring mechanism, and being disposed between the first substrate processing stage and the second substrate processing stage to receive the substrate from the substrate processing stage;
a substrate supporting stage mainly comprising a second supporting stage and a supporting mechanism to support the second supporting stage, the second supporting stage perpendicularly extend from a top of the supporting mechanism, and being disposed adjacent to the substrate transferring stage to receive the substrate from the substrate transferring stage; wherein the first transferring mechanism transfers the first supporting stage to above the second supporting stage, and the second transferring mechanism transfers the first supporting stage from above the second supporting stage to below the second supporting stage so as to deposit the substrate originally supported on the first supporting stage onto the second supporting stage; the first supporting stage comprises first supporting bars spaced apart from each other, the second supporting stage comprises second supporting bars spaced apart from each other, and in the process of transferring the first supporting stage from above the second supporting stage to below the second supporting stage, the first supporting bars and the second supporting bars are interlaced with each other;
a substrate conveying and transshipping stage comprising a second base and a second roller-type transferring means mounted on the second base, and being disposed in parallel with the substrate outlet stage to receive the substrate from the substrate supporting stage by the second roller-type transferring means and to transfer the substrate to the substrate outlet stage via the first roller-type transferring means;
a first vacuum adsorption transferring device, being adapted to adsorb the substrate from the substrate processing stage to the substrate transferring stage; and
a second vacuum adsorption transferring device, being adapted to adsorb the substrate from the substrate supporting stage to the substrate conveying and transshipping stage;
wherein the second supporting stage and the supporting mechanism of the substrate supporting stage are neither removable nor rotatable, and locations of the second supporting stage, the supporting mechanism, the second base of the substrate conveying and transshipping stage, and the first base of the substrate outlet stage are always kept fixed during all the time of that the substrate is transferred from the first substrate processing stage or the second substrate processing stage to the substrate outlet stage.

10. The substrate transferring system of claim 9, wherein the first transferring mechanism is a horizontal movement mechanism or a horizontal rotation mechanism, and the second transferring mechanism is a vertical movement mechanism.

11. The substrate transferring system of claim 9, wherein the number of the first supporting bars is three, and the number of the second supporting bars is two.

* * * * *